United States Patent
Xue et al.

(10) Patent No.: US 9,923,599 B1
(45) Date of Patent: Mar. 20, 2018

(54) TERAHERTZ INJECTION-LOCKED RADIATOR

(71) Applicant: City University of Hong Kong, Kowloon (HK)

(72) Inventors: Quan Xue, Tai Po (HK); Liang Wu, Tai Wai (HK)

(73) Assignee: City University of Hong Kong, Kowloon (HK)

(*) Notice: Subject to any disclaimer, the term of this patent is extended or adjusted under 35 U.S.C. 154(b) by 0 days.

(21) Appl. No.: 15/492,876

(22) Filed: Apr. 20, 2017

(51) Int. Cl.
| | |
|---|---|
| *H04B 1/04* | (2006.01) |
| *H04B 3/06* | (2006.01) |
| *H03B 19/14* | (2006.01) |
| *H01Q 21/22* | (2006.01) |
| *H04B 3/466* | (2015.01) |

(52) U.S. Cl.
CPC .............. *H04B 3/06* (2013.01); *H01Q 21/22* (2013.01); *H03B 19/14* (2013.01); *H03B 2200/0074* (2013.01); *H04B 3/466* (2013.01)

(58) Field of Classification Search
CPC ... H04B 1/04; H04B 1/16; H04B 3/06; H03B 19/00; H03B 19/16; H01Q 3/28; H01Q 3/42; H01Q 3/34; H01Q 3/30; H01Q 21/22; H03L 7/18; H03L 7/1976
See application file for complete search history.

(56) References Cited

U.S. PATENT DOCUMENTS

| | | |
|---|---|---|
| 8,797,105 B2 | 8/2014 | Afshari et al. |
| 9,344,308 B2 | 5/2016 | Han et al. |

(Continued)

FOREIGN PATENT DOCUMENTS

WO   WO-2015120374 A1   8/2015

OTHER PUBLICATIONS

Sengupta K. et al., "A 0.28 THz Power-Generation and Beam-Steering Array in CMOS Based on Distributed Active Radiators," IEEE J. Solid-State Circuits, vol. 47, No. 12, pp. 3013-3031, Dec. 2012, 19 pages.

(Continued)

*Primary Examiner* — Thanh Le
(74) *Attorney, Agent, or Firm* — Norton Rose Fulbright US LLP (57) ABSTRACT

Systems and methods which provide injection-locked circuit configurations for radiating signals in the terahertz frequency range with improved phase noise and signal output power are described. Embodiments of the invention provide an injection-locked terahertz radiator system comprising a half-quadrature voltage controlled oscillator (HQVCO), a plurality of injection-locked frequency quadruplers (ILFQs), and antenna elements. In operation according to embodiments, injection-locking provided by the ILFQs may be utilized to facilitate individual optimization of the output power and the phase noise. Intrinsic-delay compensation and harmonic boosting techniques may be utilized in configurations of the foregoing injection-locked terahertz radiator system to optimize the phase noise of the HQVCO and the output power of the ILFQs, respectively. Embodiments of an injection-locked terahertz radiator system herein are implemented as a fully integrated solution with compact form factor, providing high reliability and low cost.

24 Claims, 9 Drawing Sheets

(56) References Cited

U.S. PATENT DOCUMENTS

| | | | |
|---|---|---|---|
| 2008/0290954 A1* | 11/2008 | Chambers | H03L 7/18 331/18 |
| 2013/0120190 A1* | 5/2013 | McCune, Jr. | H01Q 3/28 342/368 |
| 2013/0135015 A1* | 5/2013 | Hossain | H03B 19/00 327/116 |
| 2015/0072630 A1* | 3/2015 | Matsumura | H04B 1/16 455/113 |

OTHER PUBLICATIONS

Tousi, Y.M. et al., "A Novel CMOS High-Power Terahertz VCO Based on Coupled Oscillators: Theory and Implementation," IEEE J. Solid-State Circuits, vol. 47, No. 12, pp. 3032-3042, Dec. 2012, 11 pages.

Grzyb J. et al., "A 288-GHz Lens-Integrated Balanced Triple-Push Source in a 65-nm CMOS Technology," IEEE J. Solid-State Circuits, vol. 48, No. 7, pp. 1751-1761, Jul. 2013, 11 pages.

Han R. et al., "A CMOS High-Power Broadband 260-GHz Radiator Array for Spectroscopy," IEEE J. Solid-State Circuits, vol. 48, No. 12, pp. 3090-3104, Dec. 2013, 15 pages.

Tousi Y. et al., "A High-Power and Scalable 2-D Phased Array for Terahertz CMOS Integrated Systems," IEEE J. Solid-State Circuits, vol. 50, No. 2, pp. 597-609, Feb. 2015, 13 pages.

* cited by examiner

TERAHERTZ INJECTION-LOCKED RADIATOR

TECHNICAL FIELD

The invention relates generally to circuits for use with respect to high frequency signals and, more particularly, to injection-locked circuit configurations for radiating signals in the terahertz frequency range.

BACKGROUND OF THE INVENTION

Various circuitry for enabling and supporting the use of relatively high frequency signals has been utilized for a number of years. For a number of reasons, such as the availability of relatively unused spectrum, radiation providing penetration of a wide variety of materials, etc., the use of signals at higher and higher frequencies has become of interest. For example, the terahertz (THz) band from 0.3 THz to 3 THz is gaining increasing interest due to its potential for use with respect to various applications, such as imaging, spectroscopy, and high-speed wireless communication.

Unfortunately, however, a technology vacuum known as "terahertz gap" exists with respect to practical and satisfactory circuit implementations for enabling and supporting the use of signals in the terahertz band. For example, major challenges are presented with respect to implementing radiating sources operable at terahertz frequencies with sufficient output power to overcome the severe path loss at such high frequencies. Currently, most terahertz sources are based on optics, quantum cascade lasers, and Gunn diodes, which are bulky and expensive making implementations of such existing circuitry undesirable and even unacceptable for many applications, such as mobile communications devices, mass-produced consumer devices, and battery powered devices.

Although some recent works have demonstrated sources and radiators from sub-THz to THz in bulk complementary metal-oxide-semiconductor (CMOS) based circuits, the inadequate cut-off frequency ($f_T$) and the low breakdown voltage of CMOS transistors significantly limit the direct current (DC) to radio frequency (RF) (DC-to-RF) conversion efficiency. In particular, many existing circuit implementations rely on relatively high-order harmonics (e.g., $4^{th}$ order harmonics) for frequency generation above 300 GHz due to insufficient fundamental oscillation frequency for lower-order harmonic extraction. As a result, the power efficiency of these existing circuits is typically as low as 0.05% and thus providing required output power levels is problematic without unacceptable power consumption and/or causing device breakdown. Phase noise, in addition to the aforementioned output power, is also an important requirement for terahertz sources utilized in many applications, such as imaging and time-domain spectroscopy. The phase noise realized by existing circuits in operation around 300 GHz is typically worse than −85 dBc/Hz at 1 MHz offset (e.g., −78 to −85 dBc/Hz at 1 MHz offset). Accordingly, the phase noise and the DC-to-RF efficiency of existing CMOS based terahertz circuit implementations are quite limited.

BRIEF SUMMARY OF THE INVENTION

The present invention is directed to systems and methods which provide injection-locked circuit configurations for radiating signals in the terahertz frequency range. For example, embodiments of the invention provide injection-locked radiator system configurations operable to generate terahertz radiation with improved phase noise and signal output power. Such injection-locked terahertz radiator systems are well suited for use in applications in numerous areas, such as security (e.g., imaging), biomedicine (e.g., imaging and spectroscopy), communication (e.g., high-speed wireless communications), astronomy (e.g., spectroscopy), etc.

Embodiments of the invention provide an injection-locked terahertz radiator system comprising a voltage controlled oscillator (VCO) providing multiple-phase output (e.g., half-quadrature VCO (HQVCO)), a plurality of injection-locked frequency multipliers (e.g., injection-locked frequency quadruplers (ILFQs)), and antenna elements of an antenna array. In operation according to embodiments, injection-locking provided by the injection-locked frequency multipliers may be utilized to facilitate individual optimization of the output power and the phase noise. Intrinsic-delay compensation and harmonic boosting techniques may be utilized in configurations of the foregoing injection-locked terahertz radiator system to optimize the phase noise of the multiple-phase output VCO and the output power of the injection-locked frequency multipliers, respectively.

Injection-locked terahertz radiator systems of embodiments herein may be implemented as a fully integrated solution with compact form factor, providing high reliability and low cost. An injection-locked terahertz radiator systems of embodiments may, for example, be implemented as a CMOS based circuit to provide generation of output signals in the terahertz band (e.g., approximately 300 GHz) having improved phase noise and DC-to-RF efficiency with respect to existing terahertz circuit implementations. As a specific example, embodiments may be implemented in a bulk 65-nm CMOS process to provide injection-locked terahertz radiator systems achieving output frequency from 311.6 GHz to 315.5 GHz and maximum equivalent isotropically radiated power (EIRP) of 10.5 dBm while consuming 300 mW, wherein the output phase noise measures −109.3 dBc/Hz at 10-MHz offset and the DC-to-RF efficiency is 0.42%.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
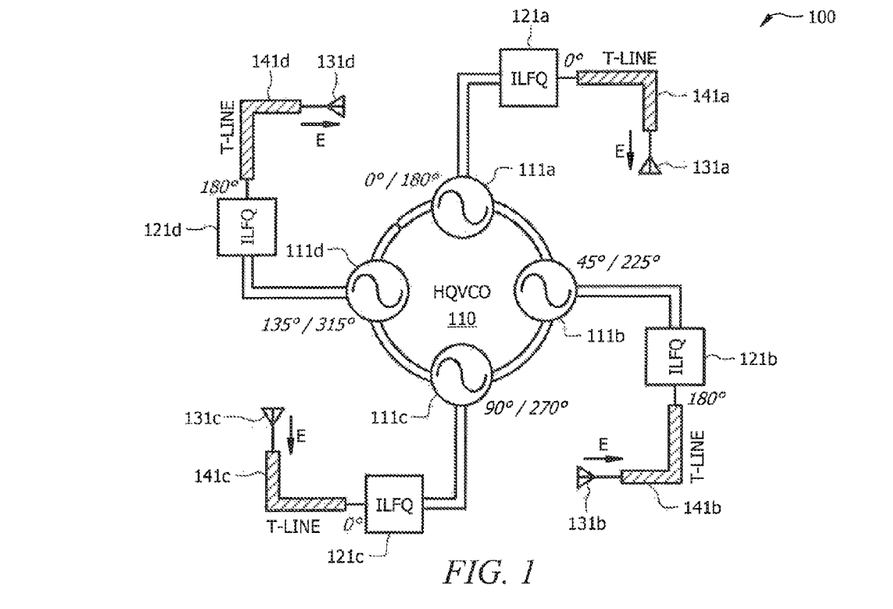
FIG. 1 shows an injection-locked terahertz radiator system configuration according to embodiments of the invention.

FIG. 1 shows an exemplary configuration of an injection-locked terahertz radiator system of embodiments of the invention. Injection-locked terahertz radiator system 100 illustrated in FIG. 1 comprises half-quadrature voltage controlled oscillator (HQVCO) 110, injection-locked frequency quadruplers (ILFQs) 121a-121d, and an antenna array including antenna elements 131a-131d.

The HQVCO of embodiments of an injection-locked terahertz radiator system implementation is constructed from a plurality of identical oscillation cells. For example, HQVCO 110 of the illustrated embodiment comprises oscillation cells 111a-111d (e.g., inductance and capacitance (LC) tank oscillator cells) connected as a ring to oscillate at frequency $f_0$, and providing differential outputs in half-quadrature relationship (e.g., the output phases being evenly spaced at 0°/180°, 45°/225°, 90°/270°, and 135°/315°).

The ILFQs of embodiments are each connected to the output of a respective oscillation cell of the HQVCO of the injection-locked terahertz radiator system. In operation, ILFQs 121a-121d each injection-lock the output of the HQVCO oscillation cell such that both the frequency and the phase are quadrupled. Accordingly, ILFQs 121a-121d of the illustrated embodiment of injection-locked terahertz radiator system 100 provide four single-ended outputs at $4f_0$ having a phase interval of 180°.

The antenna elements of the antenna array of embodiments of the injection-locked terahertz radiator are fed by a respective one of the ILFQs to excite electromagnetic (EM) waves for radiating and power combining in free space. For example, ILFQs 121a-121d each feed a respective one of antenna elements 131a-131d (e.g., via a corresponding one of transmission lines 141a-141d) in the embodiment illustrated in FIG. 1. Antenna elements 131a-131d may, for example, comprise slot antennas according to some embodiments, wherein the slot structures may be configured to improve the directivity and/or antenna gain and/or bandwidth (e.g., the slots may be tapered, segmented, etc.).

In operation of an injection-locked terahertz radiator system of embodiments, both the frequency and the phase noise of the radiator are determined under locking by the HQVCO. As the ILFQs of embodiments can self-oscillate, their output power is not sensitive to the inputs from the HQVCO. Accordingly, the frequency and the power generation of the exemplary injection-locked terahertz radiator system are decoupled from each other. Thus, injection-locked terahertz radiator systems of embodiments of the invention can simultaneously achieve low phase noise and high output power by optimizing the HQVCO and the ILFQs, respectively.

It should be appreciated that, conventional millimeter wave (mmW) LC VCOs typically suffer from limited phase noise performance primarily due to the inclusion of low-Q varactors for frequency tuning. Although tuning techniques without using varactors have been reported in recent years, the intrinsic time delay of the transistors has been overlooked in both the conventional LC VCOs and varactor-less VCOs. At radio frequencies, the transistor delay has minimal effect and thus can generally be ignored. However, as the frequency increases, the transistor delay may contribute significant phase shift and affect the oscillation of the VCO.

Figure 2A:
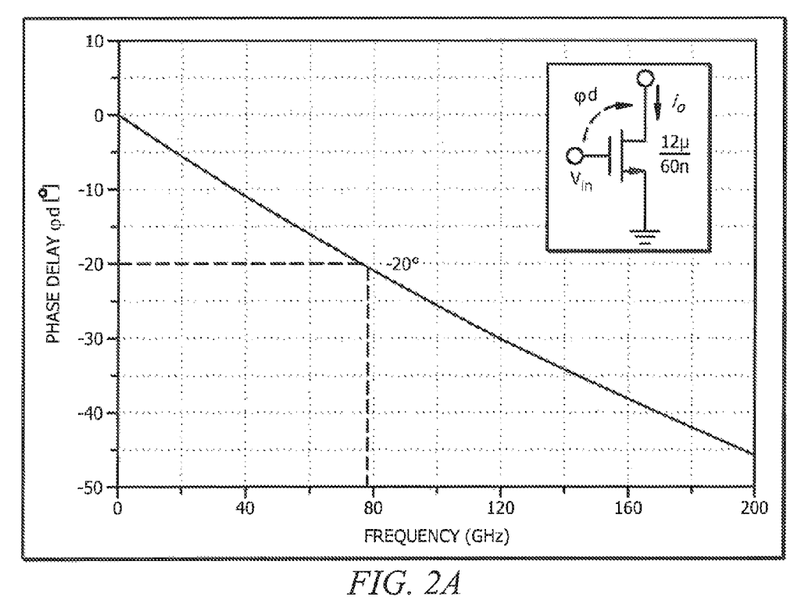
FIG. 2A shows a graph of phase delay relative to frequency for intrinsic phase delay in an NMOS transistor.
Figure 2B:
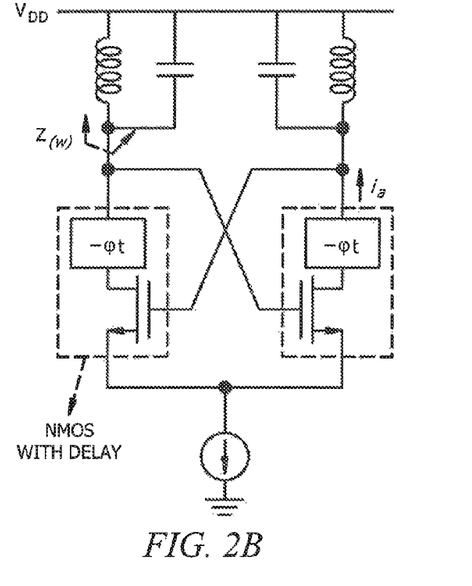
FIG. 2B shows a schematic diagram of a conventional cross-coupled LC VCO circuit.

Periodic steady-state simulations in SPECTRERF indicate that the delay of a 65-nm N-type metal-oxide-semiconductor (NMOS) device with size of 12 μm/60 nm is approximately 0.7 ps. A delay of 0.7 ps corresponds to a phase shift ($\varphi_d$) of −20° at 80 GHz, as shown in the simulated intrinsic phase delay in an NMOS transistor at different frequencies graph of FIG. 2A. Accordingly, for a cross-coupled LC VCO, such as the conventional LC VCO shown in the schematic diagram of FIG. 2B, there is a negative phase shift of $-\varphi_t = -(\varphi_d + \varphi_p)$ between the self-oscillating current $i_a$ and the transistor's input voltage, where $-\varphi_d$ is the phase delay contributed by the transistor and $-\varphi_p$ is the routing parasitics of the circuit configuration.

Figure 3A:
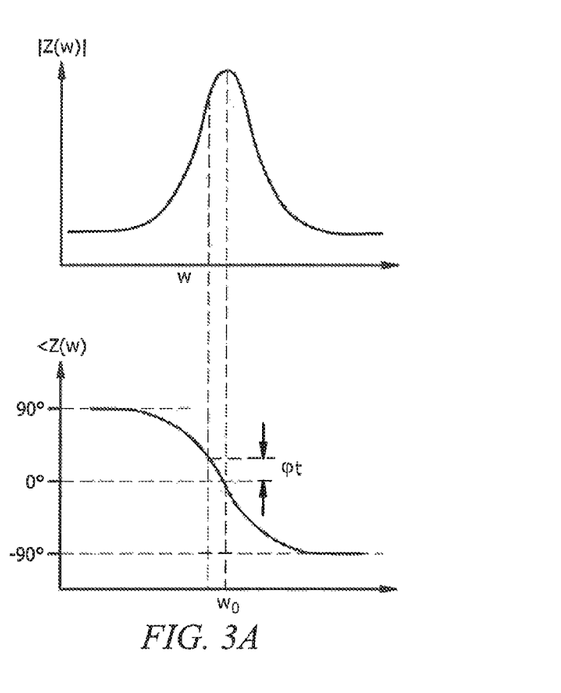
FIG. 3A shows a plot of tank impedance for a LC tank oscillator cell of embodiments of the invention.

The HQVCO of embodiments of an injected-locked terahertz radiator system herein is configured with intrinsic-delay compensation with respect to the transistor induced phase delay. For example, the LC tank of each of oscillator cells 121a-121d may be configured to contribute some positive phase shift in order to fulfill the phase condition for oscillation. Accordingly, the oscillation frequency of embodiments may be displaced from the resonant frequency ($\omega_0$) of the LC tank, as shown in the tank impedance plot of FIG. 3A, resulting in reduced output amplitude and lower effective tank Q.

Figure 3B:
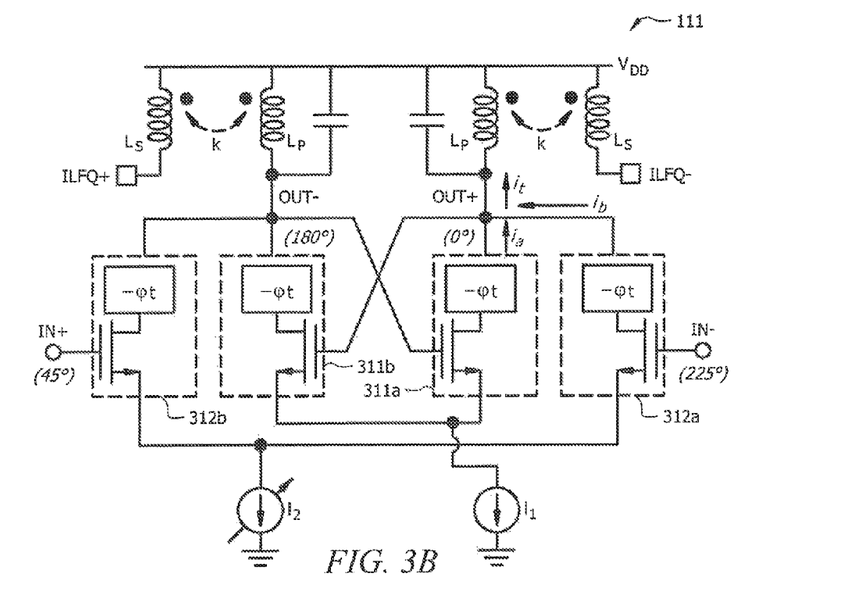
FIG. 3B shows a schematic diagram of a cross-coupled LC VCO circuit of embodiments of the invention.
Figure 3C:
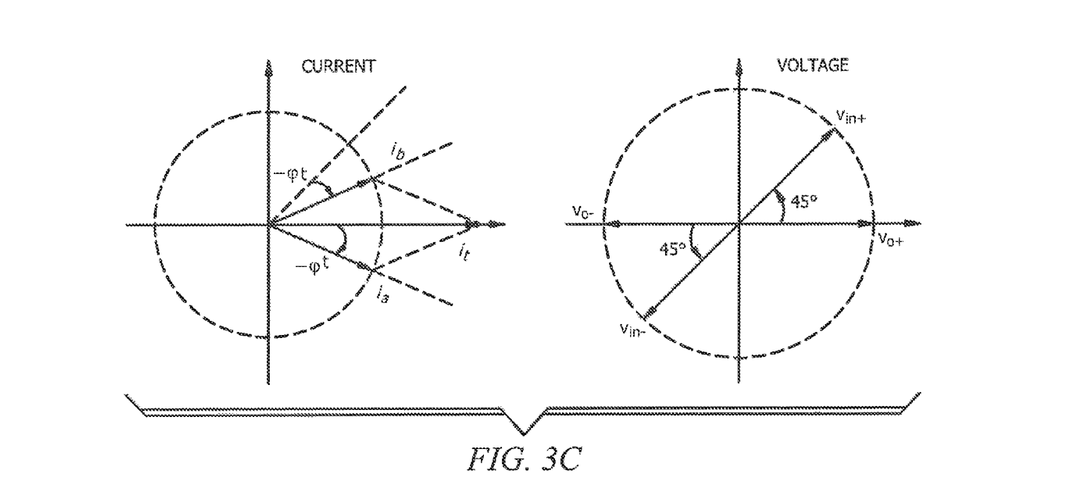
FIG. 3C shows phasor diagrams for a cross-coupled LC VCO circuit of embodiments of the invention.

FIG. 3B shows a schematic diagram of a cross-coupled LC VCO circuit as may be utilized for each of oscillator cells 121a-121d of embodiments of HQVCO 120. As can be appreciated from the phasor diagrams of FIG. 3C, the phase delay of $i_a$ in the LC VCO circuit may be compensated if another current $i_b$ with phase advance and having a y-axis component equal to that of $i_a$ is injected into the LC tank. As can be appreciated from the exemplary circuit schematic diagram of FIG. 3B, cross-coupled transistor current $i_a$ is generated by the cross-coupled transistors (e.g., transistors 311a and 311 b) while the compensation current $i_b$ may be injected by a differential transistor pair (e.g., transistors 312a and 312b) according to embodiments of the invention. The injection devices (e.g., transistors 312a and 312b) of embodiments are designed to be of the same size as the cross-coupled pairs (e.g., transistors 311a and 311b) and their DC operating points are optimized to make the oscillator operate in the boundary between the current-limit and voltage-limit regimes. In operation of the delay compensated oscillation cell of embodiments, the x-axis component of the phase compensation current $i_b$ adds up with that of the cross-coupled transistor current $i_a$, as shown in FIG. 3C, which counteracts the tank loss and sustains the oscillation.

Figure 3D:
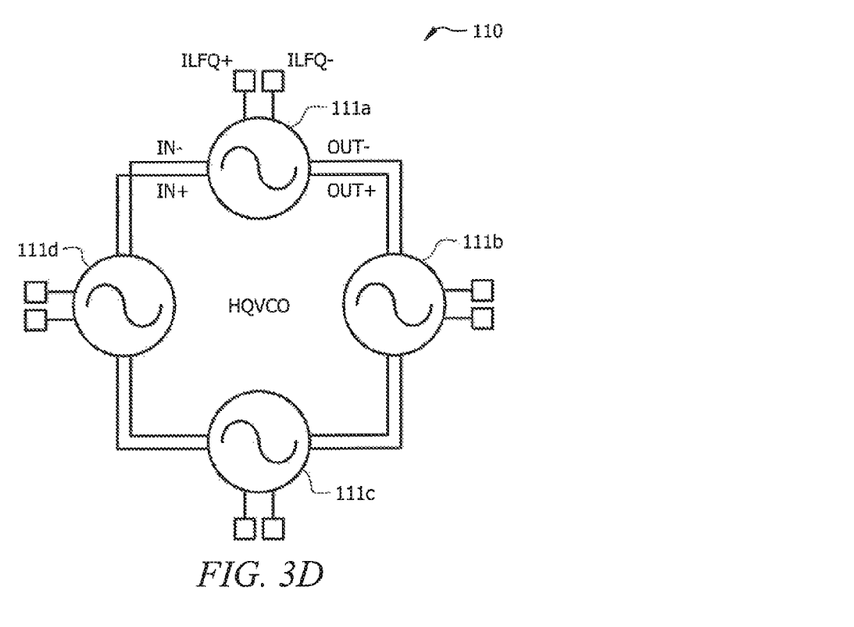
FIG. 3D shows an HQVCO implementation comprising oscillation cells connected as a ring in accordance with embodiments of the invention.

The phase advance implemented with respect to a HQVCO of embodiments herein may be provided by utilizing multi-phase oscillation. For example, as shown in FIG. 1, four oscillation cells are connected as a ring in an implementation of a HQVCO according to embodiments. As illustrated in FIG. 3D the current injection of such a configuration of oscillation cells provides sufficient coupling between neighboring oscillator cells that multi-phase oscillation is obtained (e.g., 8-phase oscillation in the exemplary four oscillation cell ring configuration). Accordingly, in light of the magnitude of the phase delay associated with embodiments of a HQVCO configuration of embodiments, 8-phase oscillation may be utilized such that the phase difference between the cross-coupled transistor current $i_a$ and the compensation current $i_b$ is 45° or approximately 45° (e.g., 45°±10%).

Figure 4:
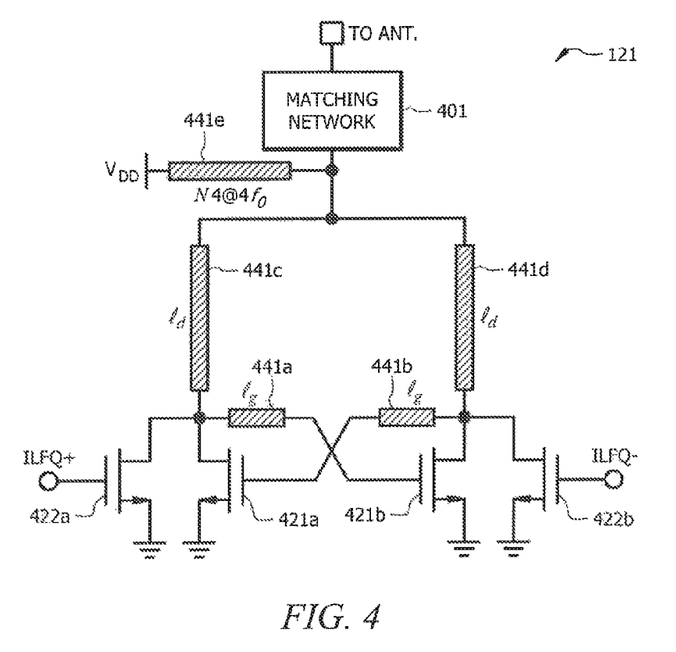
FIG. 4 shows a schematic diagram of an ILFQ circuit of embodiments of the invention.

The ILFQs of embodiments of an injected-locked terahertz radiator system herein are configured with forth-order harmonic boosting implemented with an injection-locked oscillator whose self-oscillation frequency is $f_0$ or approximately $f_0$ (e.g., $f_0$±10%). Embodiments of ILFQs 121a-121d may, for example, comprise a cross-coupled transistor pair (e.g., transistors 412a and 421b) for sustaining the self-oscillation and a differential transistor pair (e.g., transistors 422a and 422b) for input injection, as shown in the schematic diagram for ILFQ 121 of FIG. 4. The self-oscillation frequency of ILFQ 121 of embodiments should be at $f_0$ to ensure proper injection-locked operation. In operation, the oscillation frequency of ILFQ 121 under locking is exactly the same as its input which comes from HQVCO 110 (e.g., $f_0$). However, by extracting the fourth-order harmonic at the output common-mode node, frequency quadrupling (e.g., $4f_0$) can be realized. It should be appreciated that, in the foregoing exemplary configuration, since the signal injection is at the fundamental frequency $f_0$ instead of the fourth harmonic frequency $4f_0$, the issue of frequency alignment between HQVCO 111 and ILFQ 121 is greatly alleviated.

In operation, although ILFQ 121 oscillates at the fundamental frequency (e.g., $f_0$), harmonic currents exist at the outputs of the transistors due to their nonlinear characteristics. The desired fourth-order harmonic current is, however, very small mainly attributed to the low voltage to current (V-to-I) harmonic conversion efficiency. Accordingly, ILFQ circuit configurations of embodiments are configured to provide power enhancement of the fourth harmonic and efficiently deliver the fourth harmonic based output signal to the antenna array. The embodiment of ILFQ 121 illustrated in FIG. 4 comprises a plurality of transmission lines, shown as transmission lines 441a-441d, such as to provide inductive loads and/or impedance transformation, utilized to facilitate power enhancement of the fourth harmonic and/or to efficiently deliver the fourth harmonic based output signal to the antenna array as discussed in further detail below.

Although increasing the input voltage amplitude with respect to the ILFQs could be used to enhance the output harmonic current, the supply voltage would have to be raised, resulting in more power consumption and even causing device breakdown (e.g., breakdown of transistors 421a, 421b, 422a, and/or 422b of ILFQ 121). Accordingly, embodiments of ILFQs herein are configured to make use of an efficient mechanism to boost the desired harmonic current, instead of solely relying on the harmonic currents resulting from the nonlinearity of the ILFQ transistors. In particular, by treating transistors 421a and 421b as two gate-pumped mixers whose pump is at the frequency of $f_0$, and then introducing a voltage signal with frequency of $2f_0$ to the input gate nodes, the second-order linearity of the transistors' transconductance can mixed with the voltage at $2f_0$ to generate much larger output current at $4f_0$ which is desired. Accordingly, the embodiment of ILFQ 121 illustrated in FIG. 4 utilizes transmission lines 441a and 441b to cross-connect the gate and the drain nodes of cross-coupled transistors (e.g., transmission line 441a cross-connecting the gate of transistor 421b and the drain of transistor 422a and transmission line 441b cross-connecting the gate of transistor 421a and the drain of transistor 422b) to sustain and boost the second-harmonic voltage at the gate nodes, resulting in significant enhancement of the desired fourth-harmonic current output.

Figure 5A:
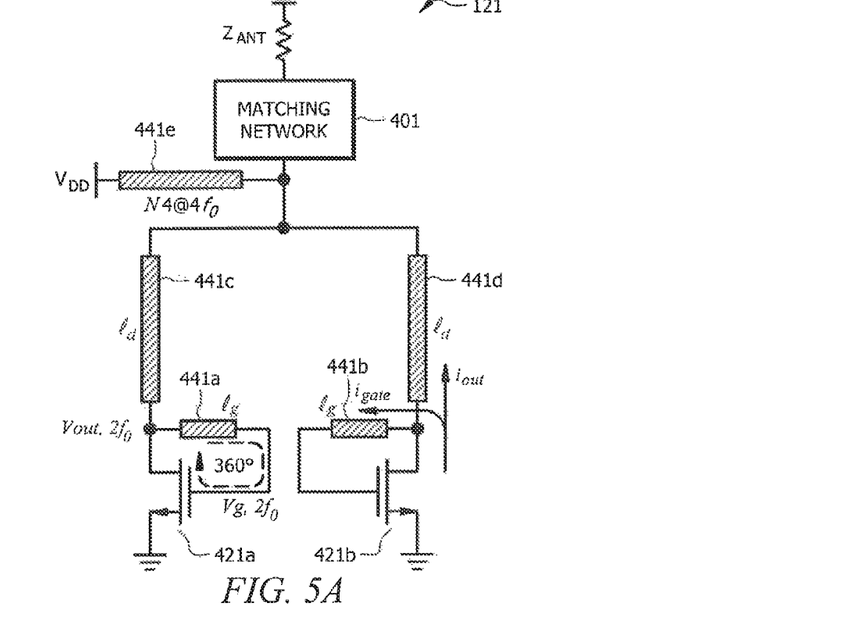
FIG. 5A shows an even mode equivalent circuit schematic of the ILFQ circuit of FIG. 4.

At the second and fourth harmonic frequencies, the ILFQ circuit operates in even mode. The even mode equivalent circuit for ILFQ 121, with transistors 422a and 422b removed for simplicity, is shown in FIG. 5A. As can be appreciated from the even mode equivalent circuit schematic of FIG. 5A, the left and right half-circuits are identical according to embodiments and can be connected together. It should be appreciated that the loop around the transistor illustrated in FIG. 5A comprises I-to-V conversion at the drain, voltage signal transmission from the drain to the gate, and V-to-I conversion by the transconductor. The length ($l_g$) of transmission lines 441a and 441b of embodiments is configured to form a 360° loop at $2f_0$ to provide positive feedback operable to help sustain the second-harmonic voltage ($v_{g,2f_0}$) at the gates of transistors 421a and 421b. Additionally, in operation of ILFQ 121 of embodiments, transmission lines 441a and 441b partially resonate with the gate capacitance, resulting in higher voltage swing at the transistor gate ($v_{g,f_0}$) compared to that at the output ($v_{out,f_0}$) and thus helping the aforementioned positive feedback provide enhanced fourth-harmonic current output.

Figure 5B:
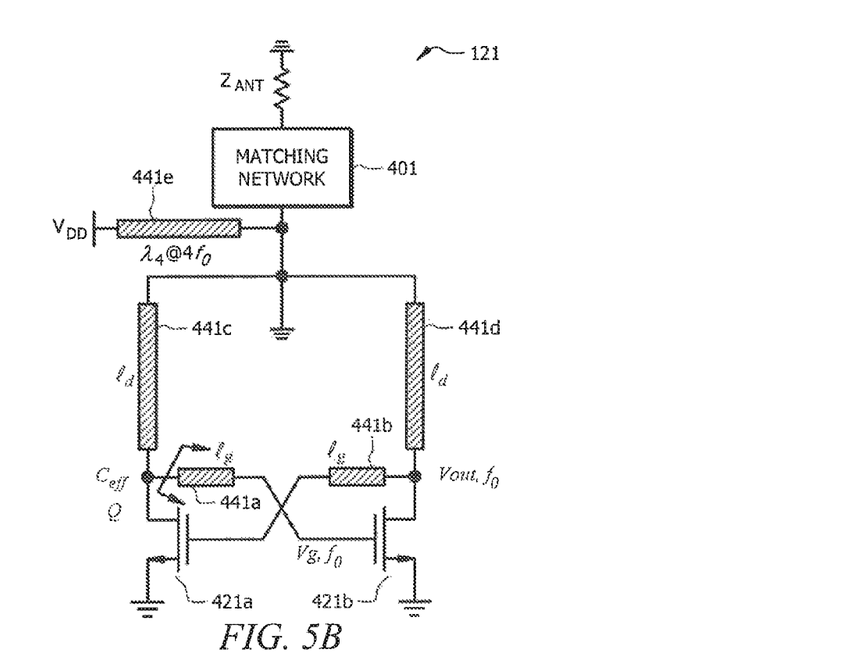
FIG. 5B shows an odd mode equivalent circuit schematic of the ILFQ circuit of FIG. 4.

Embodiments of ILFQs herein are configured to efficiently deliver the fourth harmonic based output signal to the antenna using a matching network. For example, the output fourth-harmonic current is optimally delivered by ILFQ 121 to an antenna element of the antenna array of injection-locked terahertz radiator system 100 by matching network 401 (e.g., comprising a matching network designed using transmission line stubs and following the widely used traditional single-stub tuning approach) providing conjugate impedance matching between the antenna element and the oscillator cell. Accordingly, the output impedance of the illustrated embodiment of ILFQ 121 looked from the common-mode node at $4f_0$ is conjugately matched with the antenna array by matching network 401. At the fundamental frequency ($f_0$), the ILFQ circuit operates in odd mode. The odd mode equivalent circuit for ILFQ 121, with transistors 422a and 422b removed for simplicity, is shown in FIG. 5B. In the embodiment illustrated in FIG. 4, $V_{dd}$ is supplied through transmission line 441e having a length of $\lambda/4$, where $\lambda$ denotes the wavelength corresponding to the frequency $4f_0$. It should be appreciated that matching network 401 of the illustrated embodiment, connected to the common-mode node which appears as AC ground at $f_0$ and odd harmonic frequencies, will not affect fundamental oscillation of ILFQ 121.

At the second-harmonic frequency $2f_0$, the above mentioned voltage transmission from the drain to the gate of the ILFQ of embodiments can be modeled as a voltage divider and calculated according to the following:

$$\frac{v_{g,2f_0}}{v_{out,2f_0}} = \frac{Z_{gate}}{Z'_{gate}} = \frac{Z_{gate}}{2Z_g} \cdot \frac{1-\Gamma_{gate}e^{-j2\beta_g l_g}}{1+\Gamma_{gate}e^{-j2\beta_g l_g}} \qquad (1)$$

where $Z_{gate}$ is the gate impedance of the transistor (e.g., transistors 421a and 421b), $\Gamma_{gate}$ is the reflection coefficient at the gate, $Z'_{gate}$ represents the equivalent gate impedance looked from the drain, and $Z_g$, $\beta_g$ and $l_g$ are the characteristic impedance, the propagation constant and the length of the transmission line (e.g., transmission lines 441a and 441b), respectively. Therefore, the phase shift can be controlled by adjusting the length ($l_g$) of the transmission line. As previously mentioned, the transistor has intrinsic delay and thus the aforementioned V-to-I conversion by the transconductor contributes a phase shift of $(180°-\varphi_{d,2f_0})$, where $-\varphi_{d,2f_0}$ represents the phase delay of the transistor at frequency $2f_0$. At the drain, the impedance for I-to-V conversion is desired to operate its peak around $2f_0$ in order to maximize the boosted voltage $v_{g,2f_0}$. As such, the phase contributed by the impedance is relatively small compared to $\angle(v_{g,2f_0}/v_{out,2f_0})$ and $\varphi_{d,2f_0}$ and thus can be neglected. As can be appreciated from the foregoing, to obtain a 360° phase shift at $2f_0$ along the loop illustrated in FIG. 5A, the length ($l_g$) of the transmission line (e.g., transmission lines 441a and 441b) is designed to fulfill the following condition:

$$\angle(v_{g,2f_0}/v_{out,2f_0})=180°+\varphi_{d,2f_0}. \qquad (2)$$

Embodiments of an ILFQ circuit configuration herein include transmission lines configured to act as an inductive load to facilitate oscillation at the fundamental frequency ($f_0$). For example, ILFQ 121 of the embodiment illustrated in FIG. 4 includes transmission lines 441c and 441d, each with length of $l_d$, operable to act as inductive loads optimized to enable fundamental oscillation at frequency $f_0$. In the presence of such transmission lines in series with the gate of the transistor, the impedance transformation performed by the transistor induces an incretion of the effective gate capacitance and Q degradation of approximately 30% at $f_0$. Although this Q degradation may result in more power being consumed for oscillation, the Q reduction benefits the locking range of the ILFQ.

Figure 6:
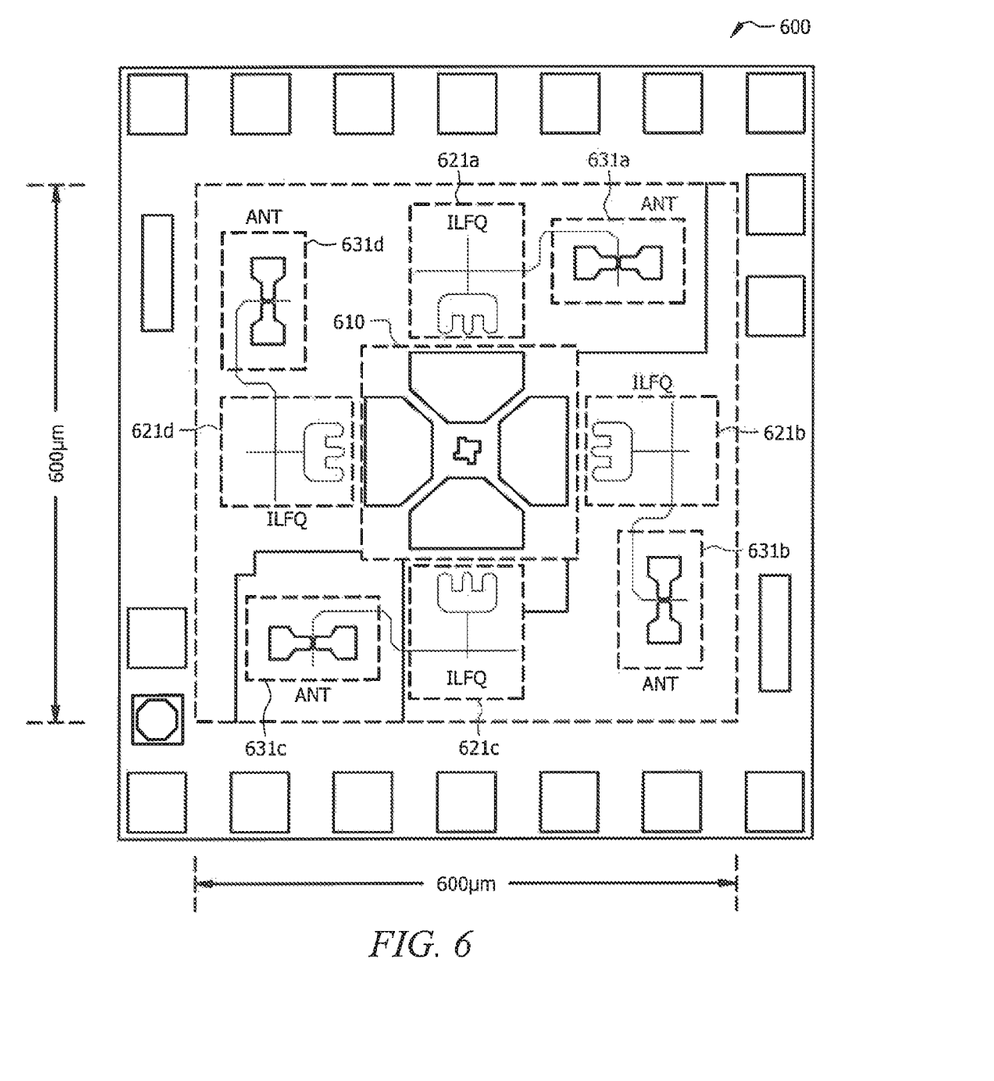
FIG. 6 shows a chip micrograph of an integrated circuit injection-locked terahertz radiator system implementation according to embodiments of the invention.

Having described circuit configurations for implementing of injection-locked terahertz radiator system 100 according to embodiments herein, an integrated circuit implementation consistent with a circuit configuration as described above is shown in the chip micrograph of FIG. 6. As the cut-off frequency ($f_T$) gradually approaches sub-THz, nanometer-scale CMOS technologies become a promising candidate to provide a fully integrated injection-locked terahertz radiator solution with compact form factor, high reliability and low cost. Accordingly, the integrated circuit injection-locked terahertz radiator system embodiment of FIG. 6 is implemented in CMOS. In particular, integrated circuit injection-locked terahertz radiator system 600 of FIG. 6, implemented in a 65 nm CMOS process, comprises HQVCO 610 oscillating at approximately 78 GHz disposed in the center of the integrated circuit surrounded by ILFQs 621a-621d operating at approximately 312 GHz and having antenna elements 631a-631c disposed in the corners of the integrated circuit. The illustrated embodiment of integrated circuit injection-locked terahertz radiator system 600 occupies a core area of 0.6×0.6 mm² excluding the pads. In operation, integrated circuit injection-locked terahertz radiator system 600 may, for example, consume 300 mW from a 1.2-V supply.

Figure 7A:
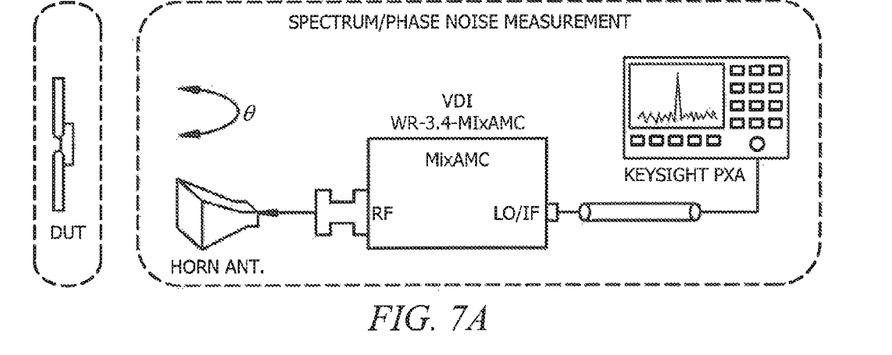
FIGS. 7A and 7B show test equipment configurations for measurement of operation of ILFQ circuits of embodiments of the invention.
Figure 7B:
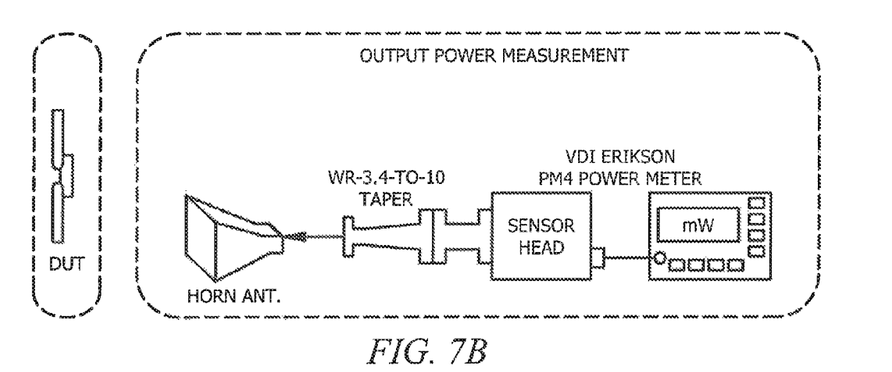

Test equipment configurations for use in measurement of operation of ILFQ circuits of embodiments is shown in FIGS. 7A and 7B. In particular, a setup for the measurement of frequency spectrum and phase noise is shown in FIG. 7A and a setup for the measurement of output power is shown in FIG. 7B. In operation of the illustrated measurement setups, the output THz signal from the radiator system is received by a horn antenna with gain of 26.5 dBi. For frequency and phase noise measurement, the received signal is down-converted by a mixer-amplifier-multiplier-chain module (e.g., VDI WR-3.4-MixAMC) whose local oscillator (LO) input and intermediate frequency (IF) output are both connected to a signal analyzer (e.g., Keysight PXA). The MixAMC module uses the 24th harmonic of the LO for down-conversion, and the undesired tones generated by mixing with other harmonics are automatically identified and not displayed in the PXA.

Figure 8A:
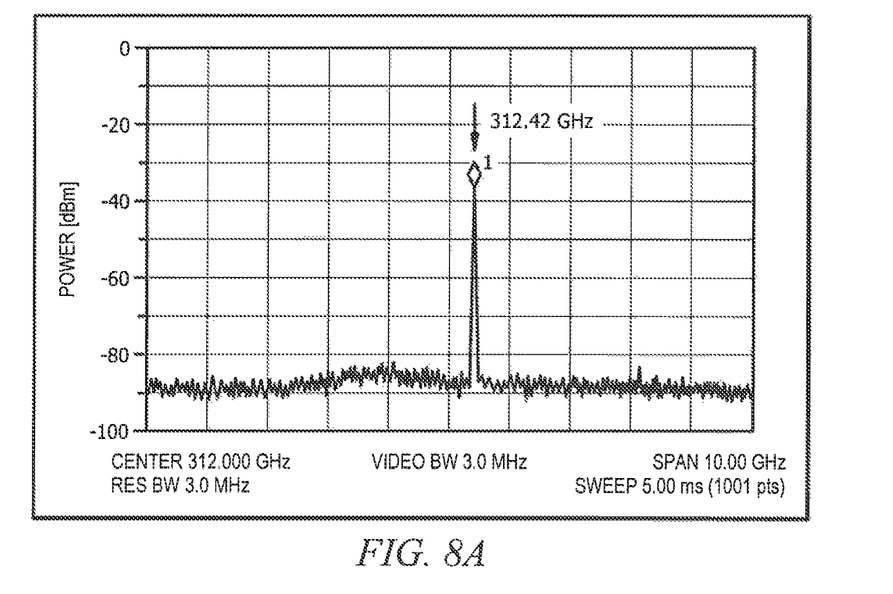
FIG. 8A shows the measured output spectrum of the integrated circuit injection-locked terahertz radiator system of FIG. 6.
Figure 8B:
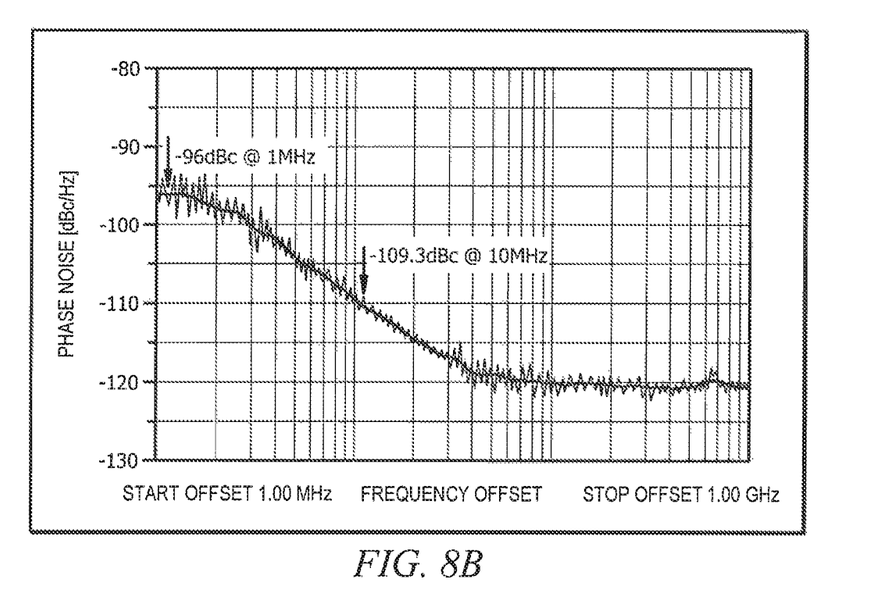
FIG. 8B shows the measured phase noise of the integrated circuit injection-locked terahertz radiator system of FIG. 6.

FIG. 8A shows the measured output spectrum of integrated circuit injection-locked terahertz radiator system 600 when the radiator output is at 312 GHz. By varying the DC current bias (e.g., $I_2$ shown in FIG. 3B) in the HQVCO, the output frequency may be tuned from 311.6 GHz to 315.5 GHz, which corresponds to a 1.3% tuning range. FIG. 8B shows the measured phase noise of integrated circuit injection-locked terahertz radiator system 600. As can be seen in the phase noise plot of FIG. 8B, the phase noise realized by integrated circuit injection-locked terahertz radiator system 600 is −96 dBc/Hz at 1-MHz offset and −109.3 dBc/Hz at 10-MHz offset.

Figure 9A:
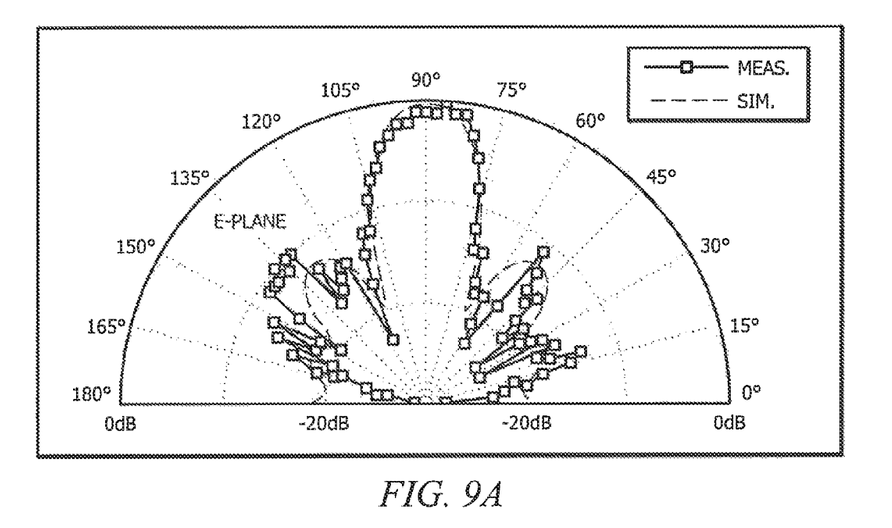
FIG. 9A shows the measured radiation pattern of the integrated circuit injection-locked terahertz radiator system FIG. 6 in the E-plane.
Figure 9B:
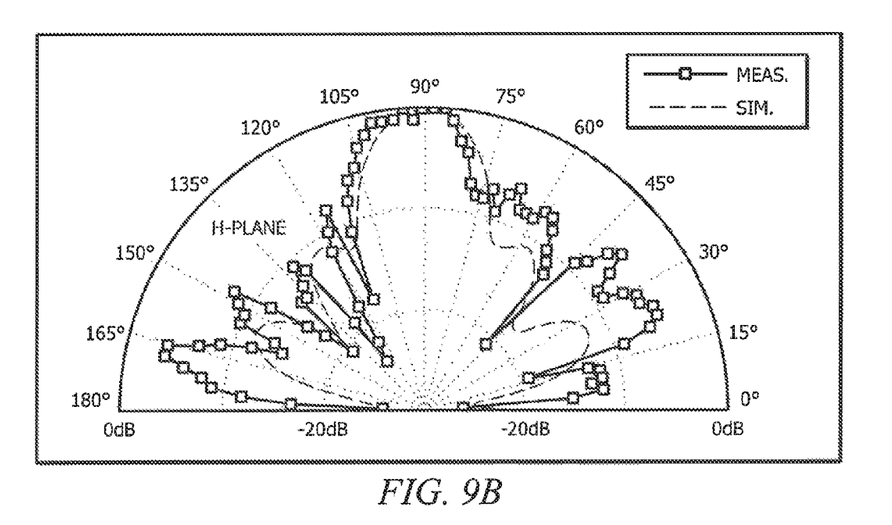
FIG. 9B shows the measured radiation pattern of the integrated circuit injection-locked terahertz radiator system of FIG. 6 in the H-plane.

FIGS. 9A and 9B show the measured radiation pattern of integrated circuit injection-locked terahertz radiator system 600 in the E-plane and the H-plane, respectively. Comparison between the measurement and the simulations shows that they agree with each other. The absolute power received by the standard horn antenna is measured by an Erikson calorimeter as shown in FIG. 7B, from which a radiated EIRP of 10.5 dBm and a total radiated power of 1.0 dBm are derived by calculation.

It can readily be appreciated from the foregoing that embodiments of an injection-locked terahertz radiator system implemented in accordance with the concepts herein may enable many useful technologies with unprecedented performance for numerous applications. For instance, imaging using terahertz radiation (T-rays) provided by an injection-locked terahertz radiator system of embodiments may be utilized to detect concealed weapons with satisfactory resolution for security checking. As another example, T-rays provided an injection-locked terahertz radiator system of embodiments may be utilized in spectroscopy for food security and air quality monitoring, short-range wireless communications with data rates of several tens of Gb/s, etc.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A high frequency radiator system comprising:
a voltage controlled oscillator (VCO) providing multiple-phase output;
a plurality of injection-locked frequency multipliers (ILFMs), wherein each ILFM of the plurality of ILFMs is coupled to a different phase output of the VCO multiple-phase output; and
an antenna array having a plurality of antenna elements, wherein each ILFM of the plurality of ILFMs is coupled to a different antenna element of the antenna array.

2. The system of claim 1, wherein the VCO is a half-quadrature VCO (HQVCO).

3. The system of claim 2, wherein the multiple-phase output provided by the HQVCO is an eight-phase output.

4. The system of claim 3, wherein at least one ILFM of the plurality of ILFMs is an injection-locked frequency quadrupler (ILFQ), wherein each ILFQ of the at least one ILFM is configured quadruple a frequency of a signal provided by a respective phase output of the HQVCO and output a quadrupled frequency signal to a respective antenna element of the antenna array.

5. The system of claim 1, wherein at least one ILFM of the plurality of ILFMs is an injection-locked frequency quadrupler (ILFQ), wherein each ILFQ of the at least one ILFM is configured for quadrupling a frequency of a signal provided by a respective phase output of the VCO and output a quadrupled frequency signal to a respective antenna element of the antenna array.

6. The system of claim 1, wherein the VCO is configured to optimize phase noise of the VCO by compensating for intrinsic-delay of one or more transistor of the VCO using phase advance.

7. The system of claim 6, wherein the phase advance is approximately 45°.

8. The system of claim 6, wherein the phase advance is implemented using a compensation current provided by multi-phase oscillation of the VCO.

9. The system of claim 8, wherein the VCO comprises:
a plurality of oscillation cells coupled in a ring configuration, wherein current injection of the ring configuration of the plurality of oscillation cells provides coupling between neighboring oscillator cells facilitating the multi-phase oscillation of the VCO.

10. The system of claim 1, wherein at least one ILFM of the plurality of ILFMs is configured to optimize output power of the at least one ILFM by providing harmonic boosting using positive feedback to enhance a desired output harmonic power.

11. The system of claim 10, wherein the desired output harmonic is at 4 times a fundamental oscillation frequency of the at least one ILFM.

12. The system of claim 10, wherein the positive feedback is implemented using a transmission line to provide a phase shift and form a 360° loop.

13. The system of claim 10, wherein the positive feedback is implemented using a transmission line to provide a phase shift and form a 360° loop at a second-order harmonic frequency.

14. The system of claim 1, wherein the VCO and the plurality of ILFM are implemented in a bulk 65-nm CMOS process to provide injection-locked terahertz radiator systems achieving output frequency from 311.6 Hz to 315.5 Hz and maximum equivalent isotropically radiated power (EIRP) of 10.5 dBm while consuming no more than 300 mW.

15. A method for radiating high frequency signals, the method comprising:
providing multiple-phase output using a voltage controlled oscillator (VCO);
multiplying a frequency of each of a plurality of signals provided the multiple-phase output using a plurality of injection-locked frequency multipliers (ILFMs), wherein each ILFM of the plurality of ILFMs is coupled to a different phase output of the VCO multiple-phase output; and
providing a frequency multiplied signal output by each ILFM of the plurality of ILFMs to a respective antenna element of an antenna array having a plurality of antenna elements, wherein each ILFM of the plurality of ILFMs is coupled to a different antenna element of the antenna array.

16. The method of claim 15, wherein the VCO is a half-quadrature VCO (HQVCO).

17. The method of claim 16, wherein the multiple-phase output provided by the HQVCO is an eight-phase output.

18. The method of claim 17, wherein at least one ILFM of the plurality of ILFMs is an injection-locked frequency quadrupler (ILFQ), wherein the multiplying the frequency using the plurality of ILFMs comprises:
quadrupling the frequency of a signal provided by a respective phase output of the HQVCO using the at least one ILFM.

19. The method of claim 15, further comprising:
compensating for intrinsic-delay of one or more transistor of the VCO using phase advance to optimize phase noise of the VCO.

20. The method of claim 19, wherein the phase advance is approximately 45°.

21. The method of claim 19, further comprising:
using a compensation current provided by multi-phase oscillation of the VCO to implement the phase advance.

22. The method of claim 15, further comprising:
providing harmonic boosting using positive feedback within at least one ILFM of the plurality of ILFMs to enhance a desired output harmonic power of the at least one ILFM.

23. The method of claim 22, wherein the desired output harmonic is at 4 times a fundamental oscillation frequency of the at least on ILFM.

24. The method of claim 22, wherein the positive feedback is implemented using a transmission line to provide a phase shift and form a 360° loop.

* * * * *

UNITED STATES PATENT AND TRADEMARK OFFICE
CERTIFICATE OF CORRECTION

PATENT NO. : 9,923,599 B1  
APPLICATION NO. : 15/492876  
DATED : March 20, 2018  
INVENTOR(S) : Quan Xue et al.

Page 1 of 1

It is certified that error appears in the above-identified patent and that said Letters Patent is hereby corrected as shown below:

In the Specification

Column 7, Line 16, delete "$j2\beta gtg$" and replace with --$j2\beta glg$--.
Column 7, Line 17, delete "$j2\beta gtg$" and replace with --$j2\beta glg$--.
Column 7, Line 23, delete "$1_g$" and replace with --$l_g$--.
Column 7, Line 27, delete "$(1_g)$" and replace with --$(l_g)$--.
Column 7, Line 38, delete "$(1_g)$" and replace with --$(l_g)$--.
Column 7, Line 48, delete "$1_d$" and replace with --$l_d$--.
Column 8, Line 33, delete "$1_2$" and replace with --$l_2$--.

In the Claims

Column 10, Claim 14, Line 14, delete "from 311.6 Hz to 315.5 Hz" and replace with --from 311.6 GHz to 315.5 GHz--.

Signed and Sealed this  
Twenty-second Day of May, 2018

Andrei Iancu  
*Director of the United States Patent and Trademark Office*